United States Patent
Mizunashi

(10) Patent No.: US 6,528,734 B2
(45) Date of Patent: Mar. 4, 2003

(54) SEMICONDUCTOR DEVICE AND PROCESS FOR FABRICATING THE SAME

(75) Inventor: Harumi Mizunashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/113,509

(22) Filed: Apr. 1, 2002

(65) Prior Publication Data

US 2002/0139571 A1 Oct. 3, 2002

(51) Int. Cl.[7] .................................................. H05K 1/16
(52) U.S. Cl. ........................ 174/255; 174/260; 29/830; 361/783
(58) Field of Search ............................... 174/255, 256, 174/260; 29/830, 846; 361/760, 783

(56) References Cited

U.S. PATENT DOCUMENTS

| | | | | |
|---|---|---|---|---|
| 4,700,473 A | * | 10/1987 | Freyman et al. ............. | 175/255 |
| 6,329,610 B1 | * | 12/2001 | Takubo et al. ............... | 174/255 |
| 6,359,234 B1 | * | 3/2002 | Kouda ......................... | 174/255 |
| 6,376,052 B1 | * | 4/2002 | Asai et al. ................... | 174/255 |

FOREIGN PATENT DOCUMENTS

| | | |
|---|---|---|
| JP | 9-64236 | 3/1997 |
| JP | 2000-260893 | 9/2000 |

* cited by examiner

*Primary Examiner*—Albert W. Paladini
(74) *Attorney, Agent, or Firm*—Choate, Hall & Stewart

(57) ABSTRACT

A packaged semiconductor device comprises a packaging substrate having a core substrate having core wiring layers formed on opposite surfaces thereof, respectively, and a plurality of core via holes in the core substrate for mutually electrically connecting the core wiring layers formed on the opposite surfaces of the core substrate. Upper and lower buildup layers, each having a wiring layer, are formed on an upper surface and a lower surface of the core substrate, respectively. A semiconductor device chip is mounted on mounting pads formed on the upper buildup layer, and externally connecting electrodes are formed on the lower buildup layer. The position of the core via holes in the core substrate is standardized, regardless of the size of semiconductor device chip to be mounted. When a semiconductor device chip having a different chip size, the mounting pads formed on the upper buildup layer are located to coincide connection terminals of the semiconductor device chip of the different kind to be mounted.

9 Claims, 9 Drawing Sheets

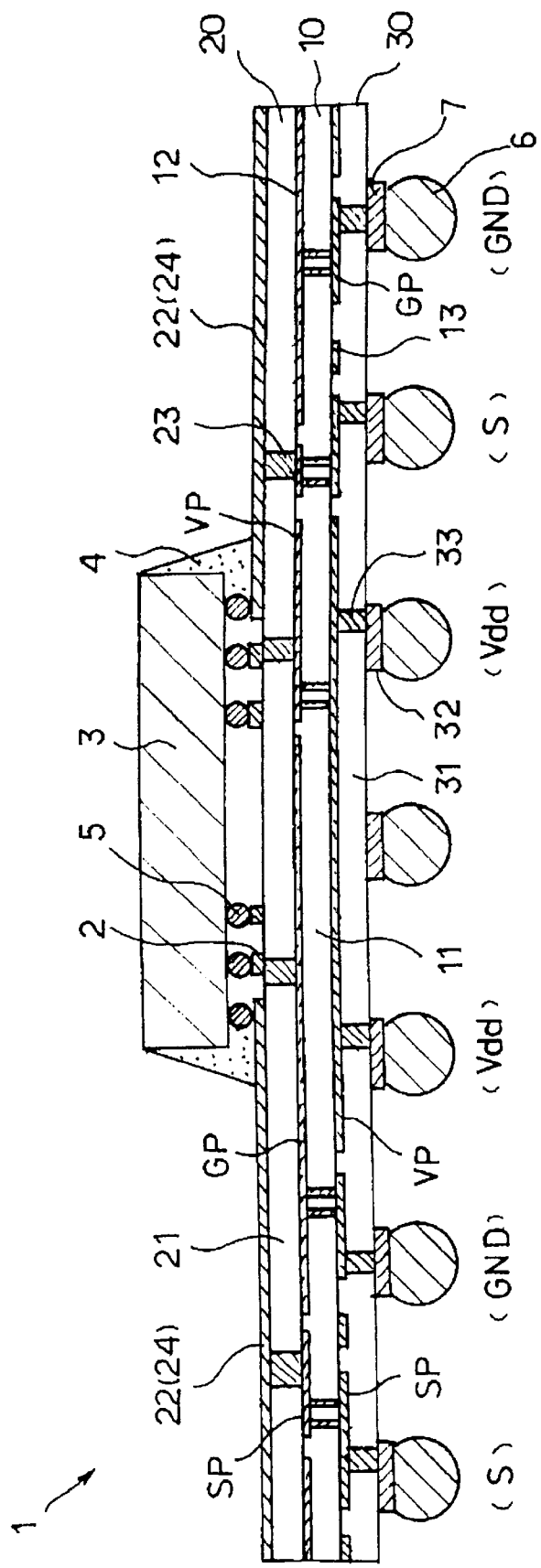

Fig. 8

SEMICONDUCTOR DEVICE AND PROCESS FOR FABRICATING THE SAME

BACKGROUND OF THE INVENTION

The present invention relates to a semiconductor device constituted of a semiconductor device chip mounted on a packaging substrate in a flip chip method, and more specifically to such a semiconductor device and a method for fabricating the same, which generalize or standardize a core substrate included in the packaging substrate thereby to reduce the cost of the semiconductor device and to simplify the fabrication of the semiconductor device.

For the purpose of microminiaturizing a semiconductor device with a high integration density, a BGA (Ball Grid Array) type semiconductor device has been proposed which includes a semiconductor device chip mounted and packaged on a packaging substrate. In brief, the BGA type semiconductor device is constructed by mounting a device chip on a front surface of a packaging substrate which has a multilayer wiring structure and which has a number of solder balls located in the form of an array on a back surface of the packaging substrate so that the packaged semiconductor device can be mounted on a mother board by utilizing the solder balls.

For example, referring to FIG. 9, there is shown a diagrammatic sectional view of the BGA package disclosed in Japanese Patent Application Pre-examination Publication No. JP-A-09-064236. A packaging substrate 101 has a multilayer wiring structure including a number of wiring layers 102 laminated as shown and electrically interconnected through via holes 103 formed in unitary substrate layers. Mounting pads 104 are formed of an uppermost wiring layer of the packaging substrate 101. Flip chip terminals 106 of a device chip 105 are connected facedown to the mounting pads 104. In addition, electrodes 107 are formed of a lowermost wiring layer of the packaging substrate 101 and a solder ball 108 is bonded on each of the electrodes 107.

In this BGA package, a lead frame is no longer necessary, and the size of the package can be reduced to a size similar to that of the device chip. Therefore, the BGA package is effective in realizing the microminiaturization and the high integration density of the semiconductor device.

In this type of BGA semiconductor device, the packaging substrate has the multilayer wiring structure in order to cause the location of the flip chip terminals of the device chip to correspond to the location of the solder balls of the packaging substrate. In order to provide the multilayer wiring structure capable of achieving this purpose, the packaging substrate having a core substrate provided with buildup wiring layers.

Referring to FIG. 10, there is shown a diagrammatic sectional view of the packaging substrate disclosed in Japanese Patent Application Pre-examination Publication No. JP-A-2000-260893. A core substrate 201 is constituted of an insulating substrate 202 having opposite surfaces having given patterns of wiring layers 203 and 204, respectively, which are electrically interconnected by via holes 205 penetrating through the core substrate 201. On the opposite surfaces of the core substrate 201, an upper buildup layer 210 and a lower buildup layer 220 are formed respectively. The upper buildup layer 210 is constituted of two elementary insulating layers 211 and 213 and two wiring layers 212 and 214 laminated as shown. Similarly, the lower buildup layer 220 is constituted of two elementary insulating layers 221 and 223 and two wiring layers 222 and 224 laminated as shown.

Mounting pads, which correspond to the flip chip terminals of the device chip, are formed of the wiring layer 214 of the upper buildup layer 210. Electrodes for the solder balls are formed of the wiring layer 224 of the lower buildup layer 220.

With the multilayer wiring structure mentioned above, the wiring layers 212 and 214 of the upper buildup layer 210 and the wiring layers 222 and 224 of the lower buildup layer 220 are electrically interconnected through via holes 215, 216, 225 and 226 formed in the buildup layers and the via holes 205 in the core substrate 201. Thus, a location of the solder balls can be adjusted independently of the location of the flip chip terminals of the device chip. For example, the same location of the solder balls can be realized even for device chips having different locations of the flip chip terminals, so that the device chips having different locations of the flip chip terminals can be mounted on the same mother board. Incidentally, the core substrate is not limited to the structure mentioned above, but can have a structure having an insulating substrate having opposite surfaces each provided with two buildup wiring layers.

In the prior art BGA type semiconductor device having the packaging substrate having the buildup layers shown in FIG. 10, the electrodes for the solder balls formed on the lower buildup layer 220 are directly determined to correspond to corresponding electrodes of the mother board. However, the mounting pad pattern formed on the upper buildup layer 210 is required to be individually determined to correspond for device chips of different kinds, for example, having different chip sizes or different patterns of flip chip terminals. Therefore, at the time of fabricating the packaging substrate, it was necessary to design the upper buildup layer 210 in accordance with the kind of the device chip to be packaged, and also to design the location of the via holes 205 in the core substrate 201 in accordance with the designed specification of the upper buildup layer 210 so as to electrically connect to the lower buildup layer 220.

As mentioned above, at each time a different kind of device chip is to be mounted, the prior art prior art BGA type semiconductor device requires to newly design and form the core substrate and the buildup layer in accordance with the kind of the device chip to mounted. However, the core substrate has the wiring layers formed on the surfaces of the insulating substrate and the via holes formed in the insulating substrate, as mentioned above. For fabricating the core substrate, it is necessary to form the necessary through holes in the insulating substrate, and to carry out an electroless plating to deposit a conducting film covering the opposite surfaces of the insulating substrate and an inner wall surface of each through hole, and then, to fill each through hole with a resin so as to prevent incursion of air, and further to pattern the conducting film deposited on the opposite surfaces of the insulating substrate. Thereafter, the buildup layers are formed on the opposite surfaces of the core substrate thus formed.

Therefore, the ratio of the number of steps for forming the core substrate to the number of total steps for forming the packaging substrate is relatively large, and accordingly, the TAT (turn around time) in the design and fabrication of the packaging substrate becomes long, with the result that the time for fabricating the packaged semiconductor device becomes long and the cost of the packaged semiconductor device correspondingly becomes high.

BRIEF SUMMARY OF THE INVENTION

Accordingly, it is an object of the present invention to provide a semiconductor device and a method for fabricating the same, which have overcome the above mentioned problems of the prior art.

Another object of the present invention is to provide a semiconductor device and a method for fabricating the same, capable of reducing the number of steps for forming the packaging substrate, thereby to reduce the term and the cost for fabricating the packaged semiconductor device.

The above and other objects of the present invention are achieved in accordance with the present invention by a packaged semiconductor device comprising a packaging substrate having a core substrate having core wiring layers formed on opposite surfaces thereof, respectively, and a plurality of core via holes in the core substrate for mutually electrically connecting the core wiring layers, and upper and lower buildup layers formed on an upper surface and a lower surface of the core substrate, respectively, and each having a wiring layer, a semiconductor device chip mounted on mounting pads formed on the upper buildup layer, and externally connecting electrodes formed on the lower buildup layer, wherein the position of the core via holes in the core substrate is standardized, and the mounting pads formed on the upper buildup layer are located to coincide connection terminals of the semiconductor device chip of a different kind.

In a preferred embodiment of the packaged semiconductor device, the core substrate includes an insulating substrate having opposite upper and lower surfaces each having at least one core wiring layer formed thereon. The mounting pads are electrically connected to the core wiring layer formed on the upper surface of the insulating substrate through buildup via holes formed in the upper buildup layer, and the externally connecting electrodes are electrically connected to the core wiring layer formed on the lower surface of the insulating substrate through buildup via holes formed in the lower buildup layer.

In another preferred embodiment of the packaged semiconductor device, each of the upper buildup layer and the lower buildup layer includes a plurality of laminated wiring layers. The mounting pads are formed of an uppermost wiring layer of the plurality of laminated wiring layers in the upper buildup layer, and a lowermost wiring layer of the plurality of laminated wiring layers in the upper buildup layer is connected to the core via holes, and the externally connecting electrodes are formed of a lowermost wiring layer of the plurality of laminated wiring layers in the lower buildup layer, and an uppermost wiring layer of the plurality of laminated wiring layers in the lower buildup layer is connected to the core via holes.

According to another aspect of the present invention, there is provided a method for fabricating a packaged semiconductor device, comprising the steps of:

forming a packaging substrate having a core substrate having core wiring layers formed on opposite surfaces thereof, respectively, and a plurality of core via holes formed in the core substrate at standardized positions for mutually electrically connecting the core wiring layers, an upper buildup layer formed on an upper surface of the core substrate and having a plurality of mounting pads, and a lower buildup layer formed on a lower surface of the core substrate and having a plurality of externally connecting electrodes; and mounting a semiconductor device chip on the mounting pads, wherein in a step for forming the upper buildup layer, a location pattern of the mounting pads formed on the upper buildup layer is determined in accordance with the kind of the semiconductor device chip to be mounted, to coincide connection terminals of the semiconductor device chip to be mounted.

In a preferred embodiment of the method for fabricating a packaged semiconductor device, each of the upper buildup layer and the lower buildup layer has one wiring layer, and at the same time as the location pattern of the mounting pads is determined, a pattern shape of a wiring layer formed at the same level as the mounting pads, a pattern shape of the core wiring layer formed on the upper surface of the core substrate, and a location position of via holes formed in the upper buildup layer for connecting between the core wiring layer formed on the upper surface of the core substrate and the wiring layer formed at the same level as the mounting pads are determined.

In another preferred embodiment of the method for fabricating a packaged semiconductor device, each of the upper buildup layer and the lower buildup layer includes a plurality of laminated wiring layers, and, in a step for forming the upper buildup layer, the mounting pads are formed of an uppermost wiring layer of the plurality of laminated wiring layers in the upper buildup layer, and a location position of the mounting pads is determined in accordance with the kind of the semiconductor device chip to be mounted, and simultaneously, a pattern shape of the uppermost wiring layer extending from the mounting pads, a pattern shape of an underlying wiring layer located under the uppermost wiring layer, and a location position of via holes formed in the upper buildup layer for connecting between the uppermost wiring layer and the underlying wiring layer are determined.

With the above mentioned arrangement, semiconductor device chips having different chip sizes can be mounted on the packaging substrate without changing the position of core via holes formed in the core substrate, by changing the mounting pads of the upper buildup layer and the wiring patterns extending form the mounding pads, in accordance with a semiconductor device chip having a different chip size to be mounted, and also by correspondingly changing the position of the via holes of the upper buildup layer.

Thus, by using the general-purpose core substrate having the standardized positions of core via holes, it is possible to mount semiconductor device chips having different chip sizes, and furthermore, to realize packaged semiconductor devices having different external sizes. As a result, the number of steps for designing and fabricating the core substrate can be reduced, so that the term and the cost for fabricating the packaged semiconductor devices can be reduced.

The above and other objects, features and advantages of the present invention will be apparent from the following description of preferred embodiments of the invention with reference to the accompanying drawings.

BRIEF DESCRIPTION OF THE DRAWINGS

FIG. 3 is a diagrammatic sectional view taken along the line A—A in FIG. 1;

FIG. 8 is a view similar to that of FIG. 3, but illustrating another embodiment of the packaged semiconductor device in accordance with the present invention;

DETAILED DESCRIPTION OF THE INVENTION

Figure 1:
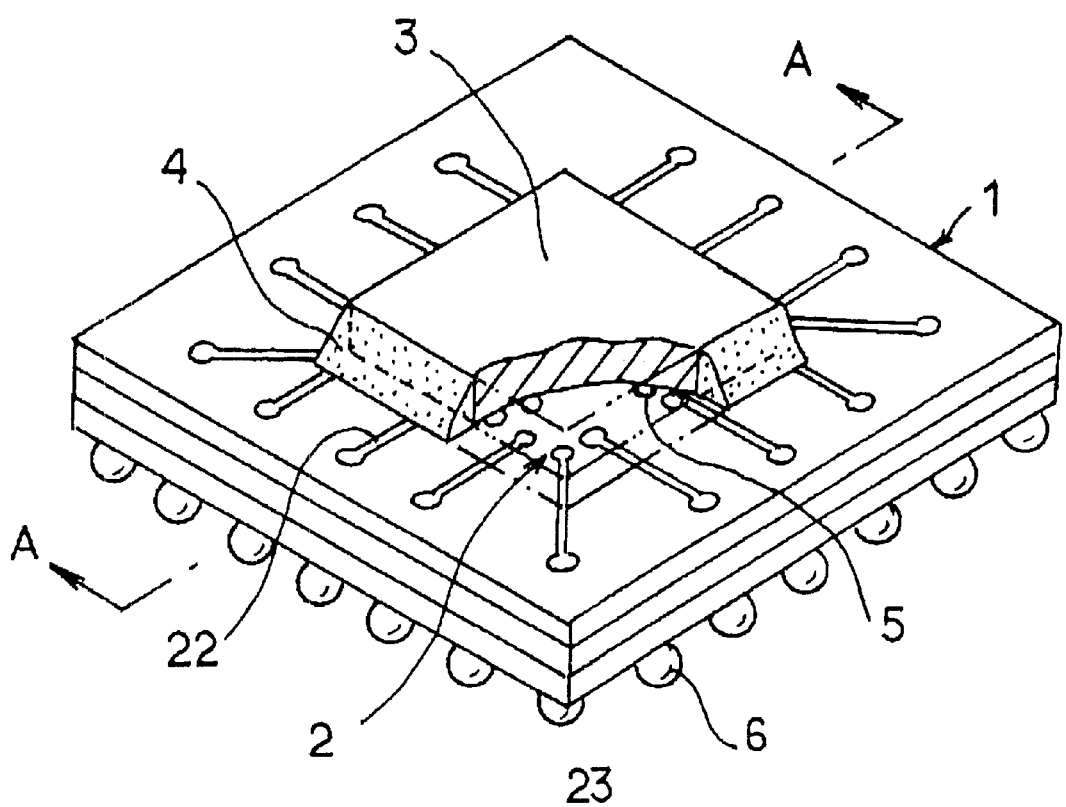
FIG. 1 is a diagrammatic, partially broken, perspective view of one embodiment of the packaged semiconductor device in accordance with the present invention.

Now, embodiments of the present invention will be described with reference to the drawings. FIG. 1 is a diagrammatic, partially broken, perspective view of one embodiment of the packaged semiconductor device in accordance with the present invention.

On an upper surface of a square packaging substrate 1 having each side of 27 mm, mounting pads 2 are formed of a portion of a wiring layer having a given pattern, and a semiconductor device chip 3 is mounted on the mounting pads 2 and is encapsulated with a resin 4.

On a lower surface of the device chip 3, a number of flip chip terminals 5 are arranged in the form of a matrix, and are mounted on and connected to the mounting pads 2 in a flip chip method. On a lower surface of the packaging substrate 1, a number of externally connecting electrodes (not shown in FIG. 1) are arranged in a given array. In this example, 619 electrodes are arranged in the form of a matrix, and a solder ball 6 is bonded on each of the electrodes. This packaged semiconductor device is placed on a circuit pattern of a not-shown mother board, and fixed and electrically connected to mounting lands formed of a portion of the mother board, circuit pattern by the solder balls 6.

Figure 2:
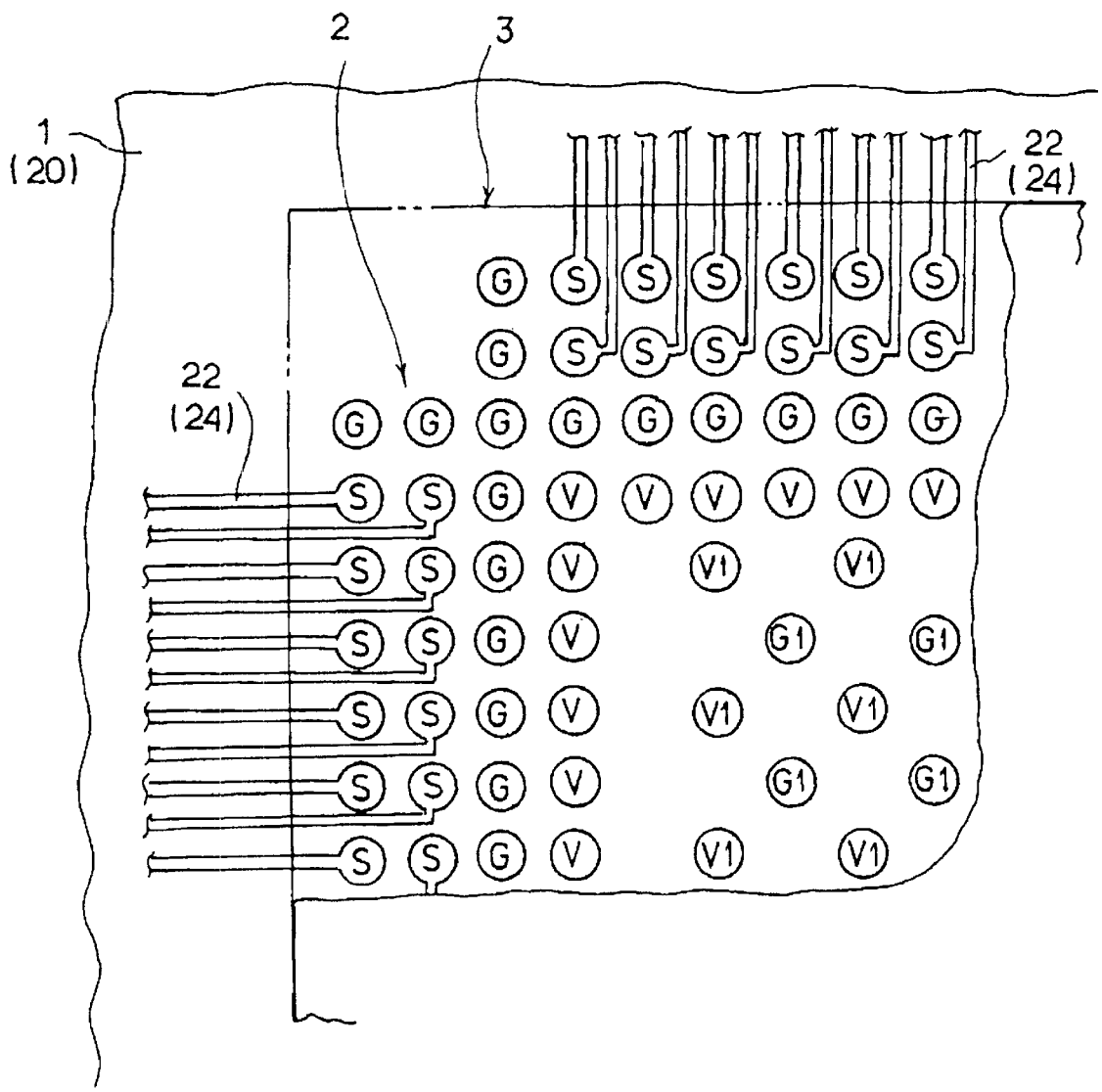
FIG. 2 is a diagrammatic, broken, plan view of a portion of the packaged semiconductor device shown in FIG. 1.

Referring to FIG. 2, there is shown a diagrammatic, broken, plan view of a portion f the packaged semiconductor device shown in FIG. 1. FIG. 3 is a diagrammatic sectional view taken along the line A—A in FIG. 1. As seen from these figures, the packaging substrate 1 is constituted as a buildup substrate having a 1/2/1 wiring layer structure. This means that the packaging substrate 1 is constituted of a core substrate 10 having an insulating substrate 11 having core wiring layers 12 and 13 formed of given patterns of conducting films formed on an upper surface and a lower surface of the insulating substrate 11, respectively, and buildup wiring layers 20 and 30 of a single layer formed on the upper and lower surfaces of the core substrate 10, respectively.

The core substrate 10 also includes through holes formed to penetrate though the insulating substrate 11 at given positions. These through holes are formed as a core via hole 14 for electrically interconnecting the corresponding wiring patterns formed on the upper surface and the lower surface of the insulating substrate 11, respectively. This core via hole 14 will be sometimes called a "C-via hole" in the following. A resin (not shown) is charged to fill an inner space of the C-via hole 14 so that an air layer will not remain within the C-via hole 14.

The upper and lower buildup wiring layers 20 and 30 have insulating layers 21 and 31, respectively, which are lapped on the upper surface and the lower surface of the core substrate 10, respectively. The insulating layers 21 and 31 have a given pattern of conducting film formed on an outside surface thereof as a buildup wiring layers 22 and 32, respectively. The insulating layers 21 and 31 also have via holes 23 and 33 at given positions, respectively, to interconnect the buildup wiring layers 22 and 32 to the corresponding upper and lower core wiring layers 12 and 13 of the core substrate 10, respectively. In the following, the via holes 23 of the upper buildup wiring layer 20 will be called a "Bu-via hole" (upper side buildup via hole), and the via holes 33 of the lower buildup wiring layer 30 will be called a "Bd-via hole" (lower side buildup via hole). The above mentioned mounting pads 2 are formed of a portion of the buildup wiring layers 22 of the upper buildup wiring layer 20, and externally connecting electrodes 7 to be bonded with the solder balls 7 are formed of a portion of the buildup wiring layers 32 of the lower buildup wiring layer 30.

As partially shown in FIG. 3, GND (ground) patterns GP are formed, as a GND plane, of a portion of the upper core wiring layer 12 of the core substrate 10. In addition, signal line patterns SP are formed of another portion of the upper core wiring layer 12, and Vdd (power supply) patterns VP are formed of still another portion of the upper core wiring layer 12. Similarly, Vdd (power supply) patterns VP are formed, as a Vdd plane, of a portion of the lower core wiring layer 13. Signal line patterns SP are formed of another portion of the lower core wiring layer 13, and GND (ground) patterns GP are formed is formed of still another portion of the lower core wiring layer 13.

The signal line pattern SP of the upper core wiring layer 12 of the core substrate 10 is electrically connected to the corresponding signal line pattern SP of the lower core wiring layer 13 of the core substrate 10 through the corresponding C-via hole 14. Similarly, the upper ground pattern GP is electrically connected to the lower GND patterns GP through the corresponding C-via hole 14, and the upper Vdd pattern VP is electrically connected to the corresponding lower Vdd pattern VP through the corresponding C-via hole 14.

Furthermore, the mounting pads 2 corresponding to the signal line, the ground and the Vdd line, are formed of different portions of the buildup wiring layer 22 of the upper buildup layer 20, respectively, in a mounting area of the device chip. Those mounting pads 2 are connected to corresponding Bu-via holes 23, so that the mounting pads 2 are electrically connected to the signal line patterns SP, the GND patterns GP and the Vdd patterns formed of the upper core wiring layer 12 of the core substrate 10, respectively.

Similarly, in the lower buildup layer 30, the signal line patterns SP, the GND patterns GP and the Vdd patterns formed of the lower core wiring layer 13 of the core substrate 10, are electrically connected to the corresponding electrodes 7 formed of the buildup wiring layer 32, through the corresponding Bd-via holes formed in the lower buildup layer 30.

Thus, the mounting pads 2 of the signal line patterns SP, the GND patterns GP and the Vdd patterns VP formed of the upper buildup wiring layer 22 on the upper buildup layer 20, are electrically connected to the corresponding solder balls 6 bonded to the electrodes 7 formed of the buildup wiring layer 32 on the lower buildup layer 30, so that signal line terminals, GND terminals and Vdd terminals are constituted of the solder balls 6.

Incidentally, a microstrip line is constituted of the signal line 24 formed of the buildup wiring layer 22 on the upper build up layer 20 and the GND pattern GP formed of the upper core wiring layer 12 in the form of the GND plane, so that a high frequency signal can be transmitted.

Figure 4A:
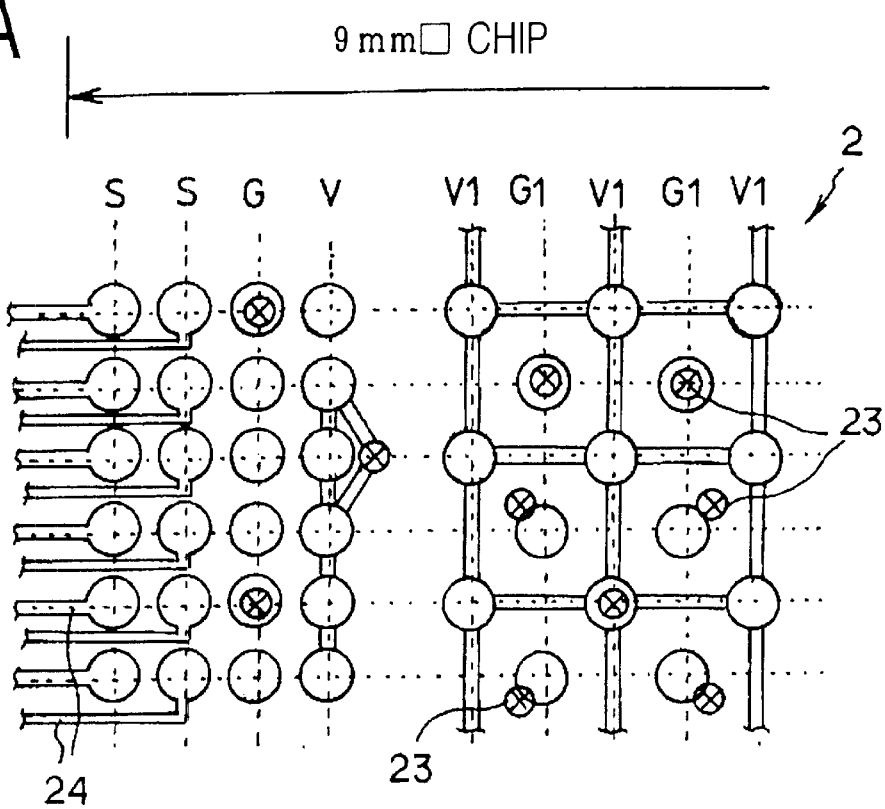
FIG. 4A is a layout pattern diagram of different wiring layers of a portion of a mounting pad region shown in FIG. 2.
Figure 4B:
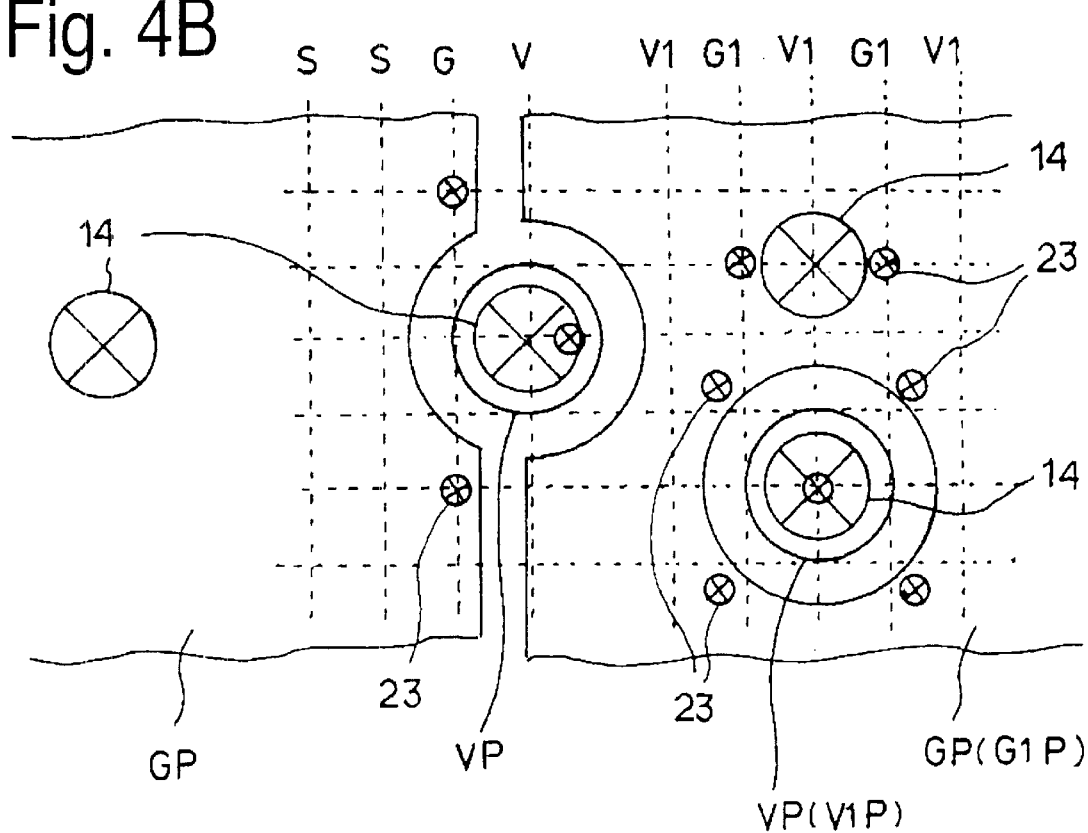
FIG. 4B is a layout pattern diagram of the upper core wiring layer of the core substrate under the mounting pad region shown in FIG. 4A.

Referring to FIG. 4A, there is shown a layout pattern diagram of the mounting pads 2 formed of the upper buildup wiring layer 22. FIG. 4B is a layout pattern diagram of the upper core wiring layer 12 of the core substrate 10 under the mounting pad region shown in FIG. 4A. Here, these figures shows an example of the device chip 3 of a 9 mm square, which is a minimum chip size.

In a region of the mounting pads of the upper buildup wiring layer 22, a number of mounting pads 2 are located in the form of a matrix. The flip chip terminals 5 of the device chip 3 includes the signal terminals, the GND terminals, the Vdd terminals, internal GND terminals and internal Vdd terminals. Correspondingly, the mounting pads 2 includes signal pads S corresponding to the signal terminals, GND pads G and Vdd pads V corresponding to the GND terminals and the Vdd terminals for supplying an electric power to a signal, and internal GND pads G1 and internal Vdd pads V1 corresponding to the internal GND terminals and the internal Vdd terminals for supplying an electric power to an internal circuit of the device chip 3. These pads are located in the form of a matrix having a pitch of 250 micrometers.

In the mounting pads, predetermined pads of the GND pads G and the Vdd pads V are interconnected, respectively, (only predetermined pads of the Vdd pads V are interconnected in the portion shown in FIG. 4A) and are connected to the Bu-via holes 23 in the upper buildup layer 20 so that the GND pads G and the Vdd pads V are electrically connected to the GND patterns GP and the Vdd patterns VP of the core substrate 10. Similarly, predetermined pads of the internal GND pads G1 and the internal Vdd pads V1 are interconnected, respectively, (only predetermined pads of the internal Vdd pads V1 are interconnected in the portion shown in FIG. 4A) and connected to the Bu-via holes 23 in the upper buildup layer 20 so that the internal GND pads G1 and the internal Vdd pads V1 are electrically connected to the GND patterns G1P and the Vdd patterns V1P of the core substrate 10. The signal pads S are extended to a peripheral region through a signal line 24, which is formed of a portion of the buildup wiring layer 22 of the upper buildup layer 20, and then, connected to the Bu-via bole 23 located within the peripheral region, so that the signal pads S are electrically connected to the signal pattern of the upper core wiring layer (GND plane) 12 of the core substrate 10.

Furthermore, as shown in FIG. 3, the signal patterns SP, the GND patterns GP and the Vdd patterns VP formed of the upper core wiring layer 12 of the core substrate 10, are connected through the C-via holes 14 in the core substrate 10 to the signal patterns SP, the GND patterns GP and the Vdd patterns VP formed of the lower core wiring layer 13 of the core substrate 10. In addition, the signal patterns SP, the GND patterns GP and the Vdd patterns VP formed of the lower core wiring layer 13 of the core substrate 10 are connected through the Bu-via hole 33 of the lower buildup layer 30 to the electrodes 7 formed by the lower buildup wiring layer 32 and located in the form of the matrix, and hence, the solder balls 6 bonded to the electrodes 7.

Figure 5A:
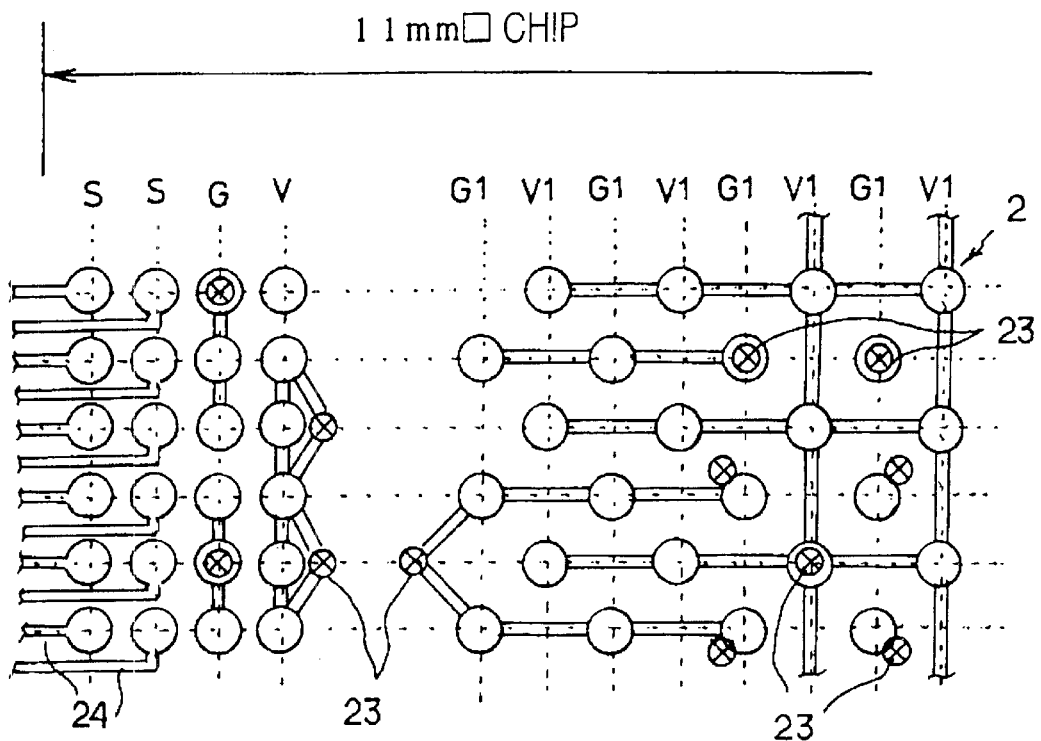
FIG. 5A is a pattern diagram of different wiring layers of a portion of a mounting pad region shown in FIG. 2, when a semiconductor device having a different chip size is mounted.
Figure 5B:
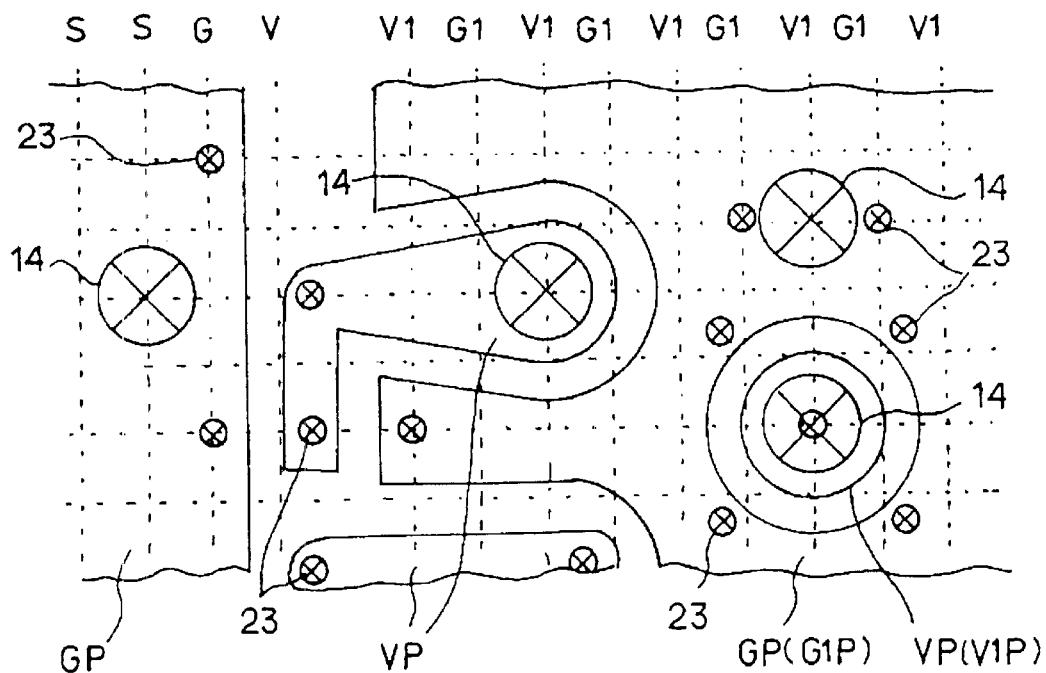
FIG. 5B is a layout pattern diagram of the upper core wiring layer of the core substrate under the mounting pad region shown in FIG. 5A.

Referring to FIG. 5A, there is shown a layout pattern diagram of the mounting pads 2 formed of the upper buildup wiring layer 22 in the case that a device chip of a 11 mm square, which is a maximum chip size, is mounted on a packaging substrate having the external size as that of the above mentioned packaging substrate 1. FIG. 5B is a layout pattern diagram of the upper core wiring layer 12 of the core substrate 10 under the mounting pad region shown in FIG. 5A.

As the result of an increase of the chip size, signal pads S are displaced outward, and a locating area of GND pads G. Vdd pads V, internal GND pads G1, and internal Vdd pads V1 is extended outward. Therefore, the position of the Bu-via holes 23 of the upper buildup layer 20 is changed in accordance with the position of the modified pads 2, and connected to the respective patterns of the upper core wiring layer (GND plane) 12 of the core substrate 10. In addition, the pattern or shape itself of the GND plane (GP, G1P) is changed, and displaced outward. Furthermore, a portion of the Vdd plane (VP, V1P) is extended outward. However, although the chip size is changed, the position of the C-via holes 14 in the core substrate 10 remains unchanged, and are maintained at the unchanged positions for the signal, GND and Vdd patterns SP, GP and VP of the upper core wiring layer (GND plane) 12.

Figure 6:
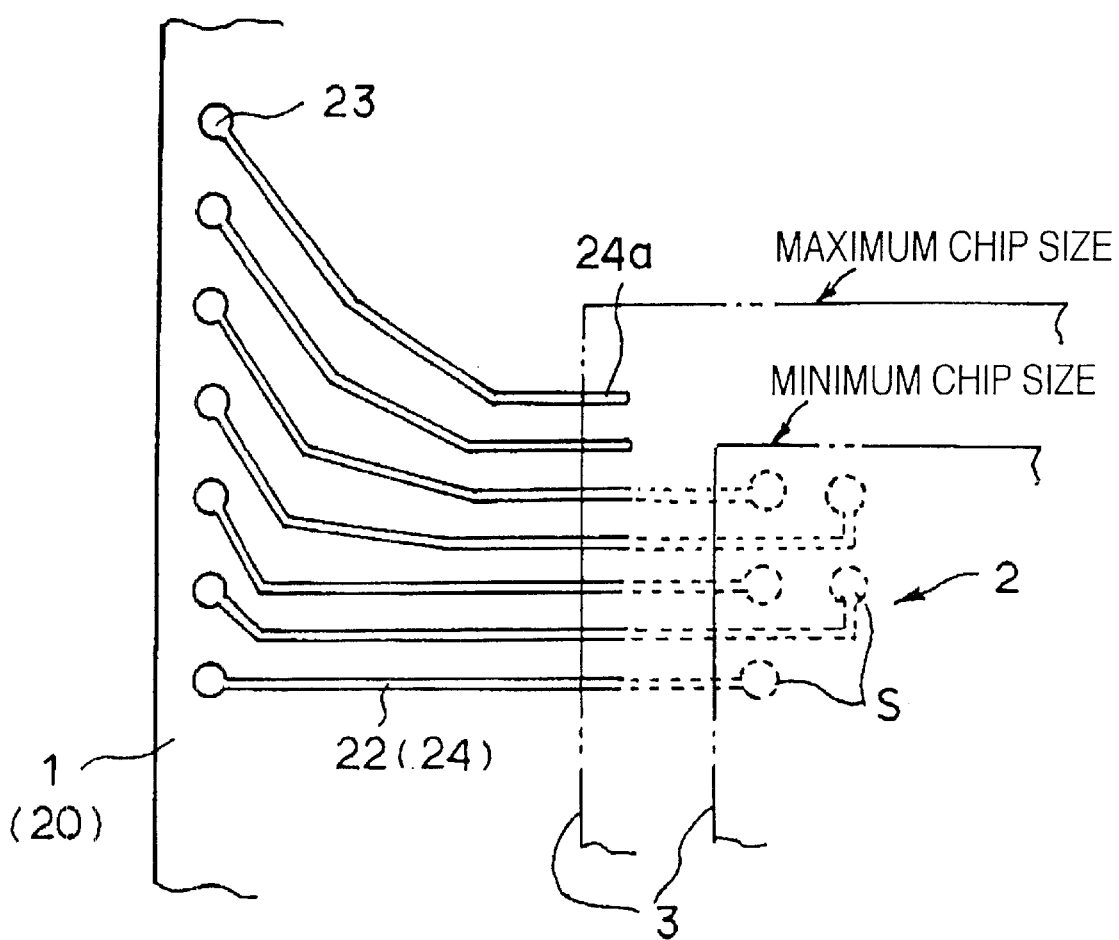
FIG. 6 illustrates a different signal line pattern.

In addition, the position where the signal line 24 extending from the signal pad S is connected to the Bu-via hole 23 of the upper buildup layer 20 remains unchanged. As shown in FIG. 6, inner ends 24a of the signal line 24 extending form the signal pad S are laid out in parallel to one another, in accordance with the maximum chip size, and when the chip size is small, a part of the signal lines 24 located at the outside of the small chip at opposite sides of the chip are not used, which are therefore omitted or grounded at the time of actually forming the packaging substrate. On the other hand, a part of the signal lines 24 located at a central area, are extended toward a center region of the small chip so that those signal lines 24 are actually used as a signal line. On the other hand, when a device chip having a large chip size is mounted, the part of the signal lines 24 located at the central area are shortened to have the same length as that of the signal lines (24a) located at the opposite side areas, so as to constitute the signal pad S similarly to the signal lines (24a) located at the opposite side areas.

Now, a process for fabricating the above mentioned packaged semiconductor device will be described with reference to FIGS. 7A to 7E, which are diagrammatic sectional views for illustrating a method in accordance with the present invention for fabricating the packaged semiconductor device.

Figure 7A:
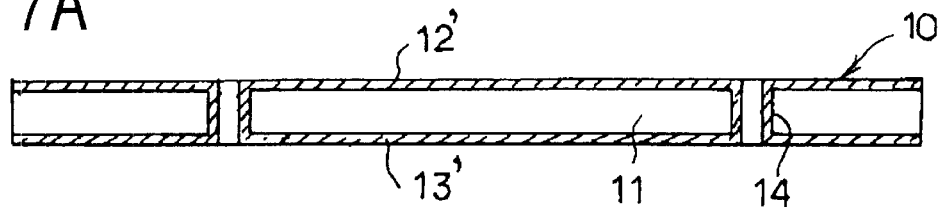
FIGS. 7A to 7E are diagrammatic sectional views for illustrating a method in accordance with the present invention for fabricating the packaged semiconductor device.

A standardized core substrate 10 is prepared which, as shown in FIG. 7A, conducting films 12' and 13' are formed on the whole of each of opposite surfaces of an insulating substrate 11, and C-via holes 14 are formed at predetermined positions.

Figure 7B:
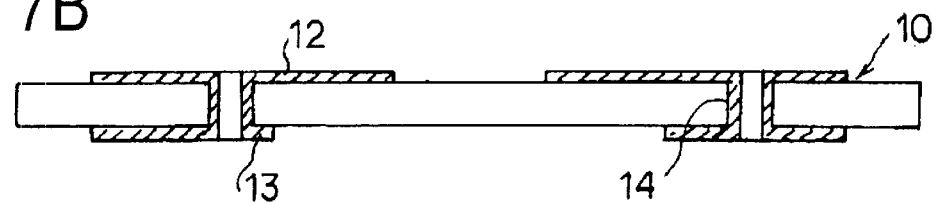

Thereafter, as shown in FIG. 7B, the conducting films 12' and 13' formed on the opposite surfaces of the core substrate 10 are patterned by lithograph using a photoresist mask, so that core wiring layers 12 and 13 are formed on an upper surface and a lower surface of the core substrate 10.

Figure 7C:
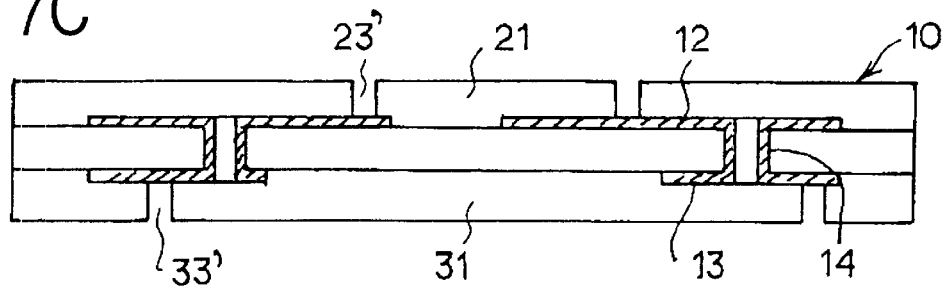

Furthermore, as shown in FIG. 7C, thermosetting resins 21 and 31 are deposited or laminated on the upper surface and the lower surface of the core substrate 10, respectively, and, holes 23' and 33' are formed at positions of Bu-via holes and Bd-via holes by a laser.

Figure 7D:
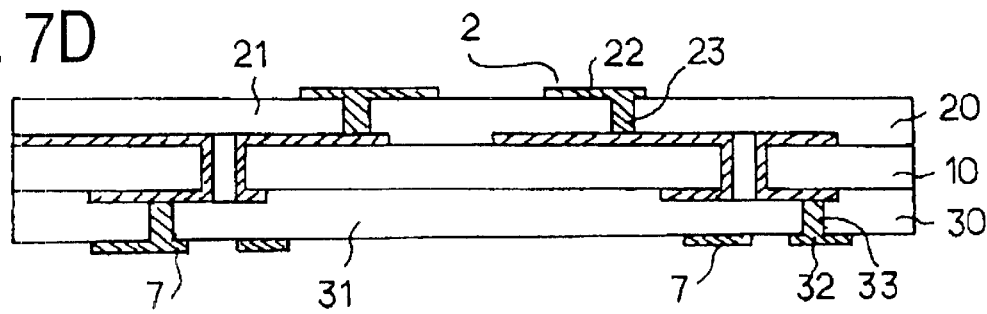

Then, as shown in FIG. 7D, an electroless plating (electroless copper plating) is carried out to form a metal film (copper film) on a surface of the thermosetting resin layers 21 and 31 and on an inner wall surface of the holes 23' and 33' formed mentioned above, and the metal film on the surface of each of the thermosetting resin layers 21 and 31 is patterned by lithography, so that the upper buildup layer 20 and the lower buildup layer 30 are formed.

On the upper buildup layer 20, there is formed a buildup wiring layer 22 having mounting pads 2 located at positions corresponding to the array of flipflop chip terminals of a device chip to be mounted. On the lower buildup layer 30, a buildup wiring layer 32 is formed as electrodes 7.

Figure 7E:
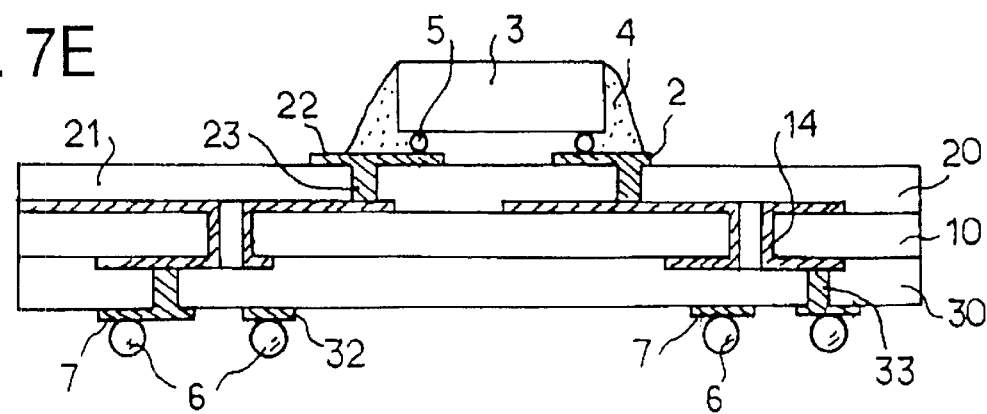
Figure 9:
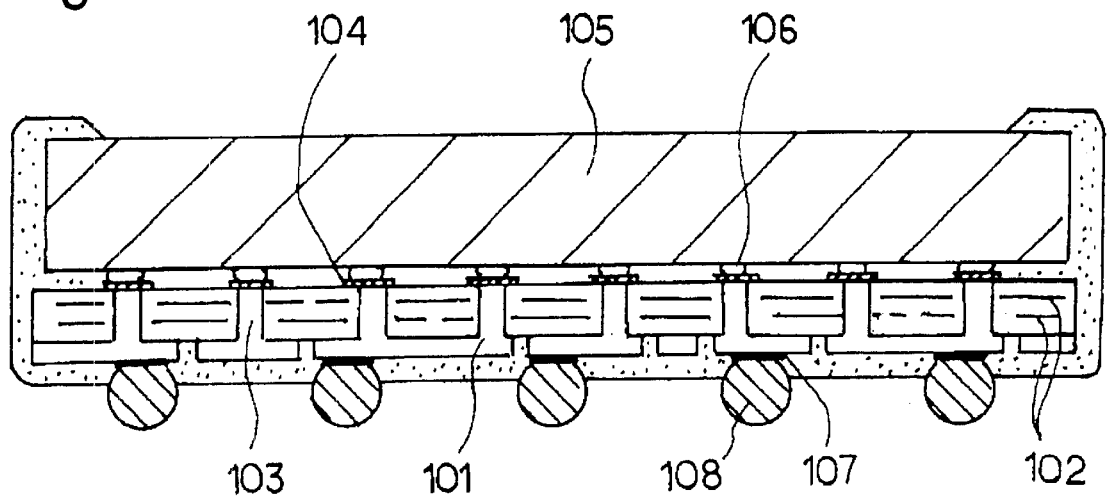
FIG. 9 is a diagrammatic sectional view of the prior art BGA type packaged semiconductor device.
Figure 10:
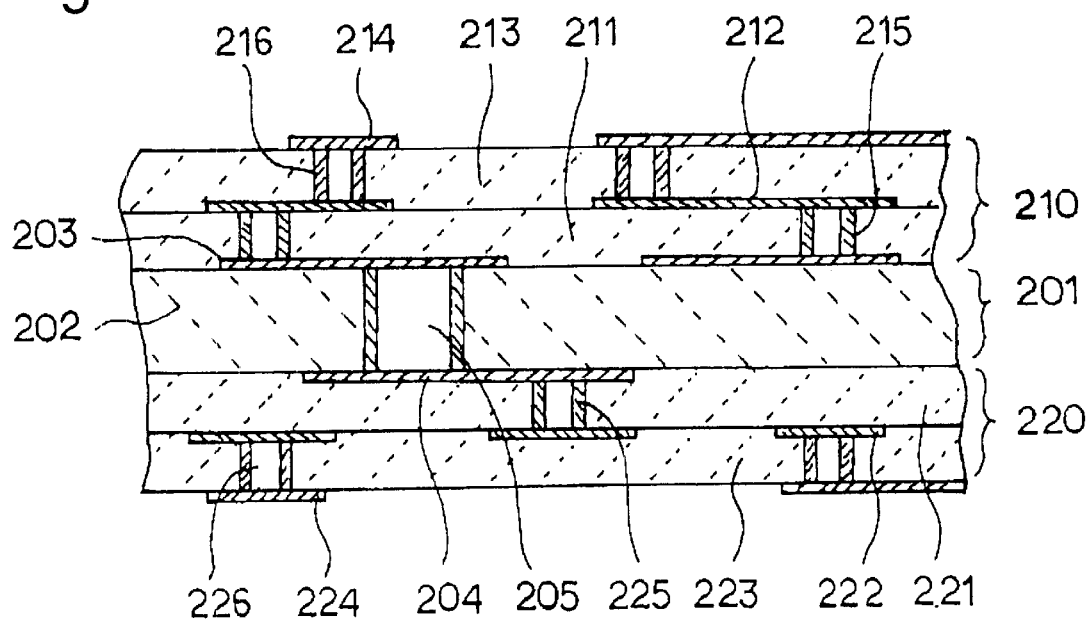
FIG. 10 is diagrammatic sectional view of a portion of the prior art packaging substrate.

Thereafter, as shown in FIG. 7E, a solder resist layer (not shown) is formed, and flip chip terminals 5 of the device chip 3 is mounted on the mounting pads 2 on the upper buildup layer 20 in a flip chip method, and a resin 4 is deposited to cover a periphery of the device chip 3. On the other hand, solder balls 6 are formed and bonded on the electrode 7 of the lower buildup layer 30 in a reflow method.

Accordingly, by changing the mounting pads 2 and the wiring pattern formed of the buildup wiring layer 22 of the upper buildup layer 20, and also by correspondingly changing the position of the Bu-via holes 23, it is possible to mount various device chips having different chip sizes. On the other hand, the pattern or shape of the GND patterns and the Vdd patterns formed of the core wiring layer 12 of the core substrate 10 is changed, but the positions of the C-via holes 14 are not changed. Therefore, it is possible to realize packaged semiconductor devices having device chips having different chip sizes packaged on a packaging substrate while a standardized general-purpose core substrate having C-via holes formed at predetermined positions, only by changing the patterns of the upper core wiring layer (GND plane) 12 of the core substrate. Accordingly, the steps for originally designing and forming a core substrate having the C-via holes placed at positions suitable to realized a desired packaged semiconductor device, are no longer necessary, with the result that the term and the cost for fabricating the semiconductor device are reduced.

Figure 8:
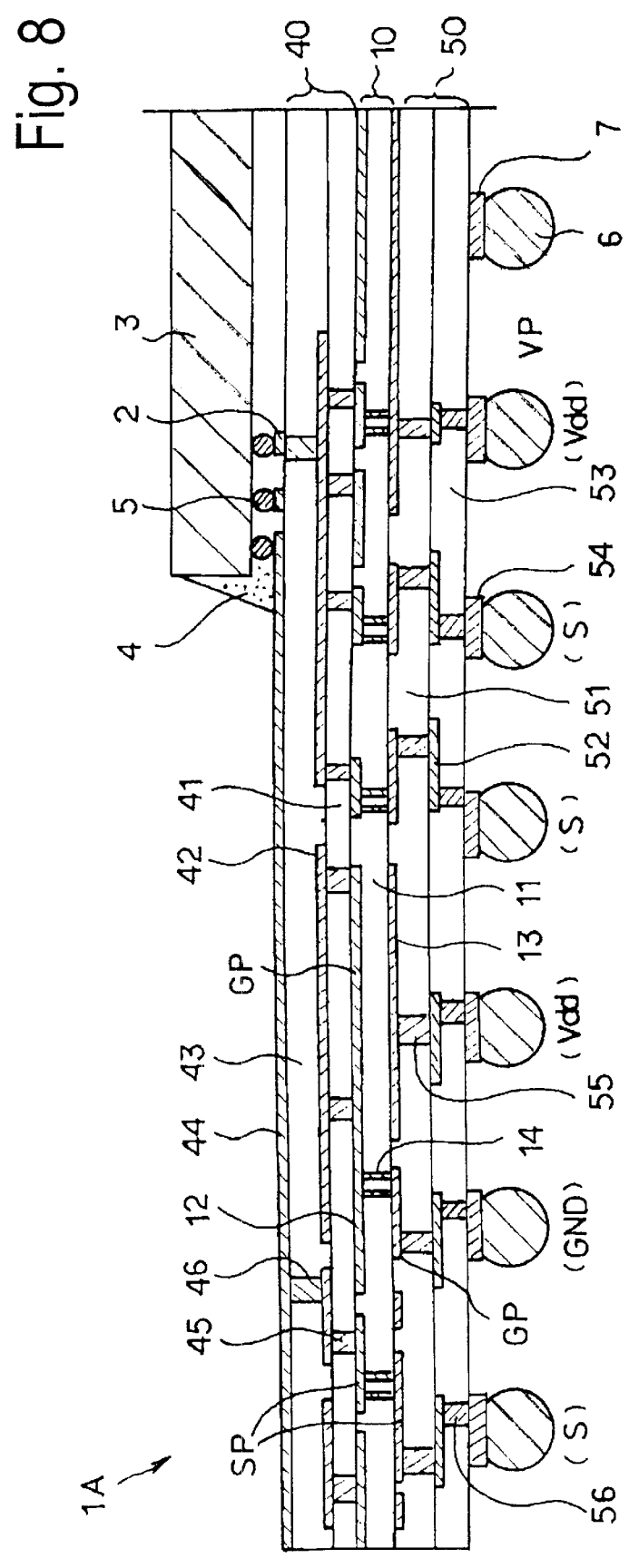

Referring to FIG. 8, there is shown a view similar to that of FIG. 3, but illustrating another embodiment of the packaged semiconductor device in accordance with the present invention.

In this second embodiment, a packaging substrate 1A is constituted of a buildup substrate having a 2/2/2 wiring layer structure. Namely, the packaging substrate 1A includes a core substrate 10 having an insulating substrate 11 having opposite surfaces provided core wiring layers 12 and 13, respectively (dual-surface substrate), and buildup layers 40 and 50 formed on upper and lower surfaces of the core substrate 10, respectively, and each having two layers of wiring layers.

Similarly to the core substrate of the first embodiment, in the core substrate 10, GND patterns GP are formed, as a GND plane, of a portion of the upper core wiring layer 12 of the core substrate 10. In addition, signal line patterns SP and Vdd patterns VP are formed of other portions of the upper core wiring layer 12. Similarly, Vdd patterns VP are formed, as a Vdd plane, of a portion of the lower core wiring layer 13. Signal line patterns SP and GND patterns GP are formed are formed of other portions of the lower core wiring layer 13. These wiring layers are connected through C-via holes 14 which are also formed in the core substrate 10.

In the upper buildup layer 40, a first upper insulating layer 41 is formed on the upper surface of the core substrate 11, and a first upper wiring layer 42 is formed by a surface of the first upper insulating layer 41 by patterning a conducting film formed on the surface of the first upper insulating layer 41 to a given pattern. Furthermore, a second upper insulating layer 43 and a second upper wiring layer 44 are formed on the first upper wiring layer 42 in a laminated manner. The first and second upper insulating layers 41 and 43 respectively have Bu1-via holes 45 and Bu2-via holes 46 formed at given positions. The patterns of the second upper wiring layer 44, the first upper wiring layer 42 and the upper core wiring layer (GND plane) 12 of the core substrate 10 are electrically interconnected through the via holes 45 and 46 thus formed.

Similarly, in the lower buildup layer 50, a first lower insulating layer 51 is formed on the lower surface of the core substrate 11, and a first lower wiring layer 52 is formed by a surface of the first lower insulating layer 51 by patterning a conducting film formed on the surface of the first lower insulating layer 51 to a given pattern. Furthermore, a second lower insulating layer 53 and a second lower wiring layer 54 are formed on the first lower wiring layer 52 in a laminated manner. The first and second lower insulating layers 51 and 53 respectively have Bd1-via holes 55 and Bd2-via holes 56 formed at given positions. The patterns of the second lower wiring layer 54, the first lower wiring layer 52 and the lower core wiring layer (Vdd plane) 13 of the core substrate 10 are electrically interconnected through the via holes 55 and 56 thus formed.

Similarly to the first embodiment, the mounting pads 2 are formed of the second upper wiring layer 44, and electrically connected to the first upper wiring layer 42 through the Bu2-via holes 46, and the first upper wiring layer 42 is connected through the Bu1-via holes 45 to the patterns SP, GP and VP formed of the upper core wiring layer (GND plane) 12. In this second embodiment, the first upper wiring layer 42 is constituted of an emphasized GND plane, so that a microstrip line is constituted of the first upper wiring layer 42 and a signal line formed of a portion of the second upper wiring layer 44, so that a high frequency signal can be transmitted.

On the other hand, electrodes 7 are formed of the second lower wiring layer 54, and electrically connected through the Bd2-via holes 56 and the Bd1-via holes 55 to the lower core wiring layer (Vdd plane) 13. A solder ball 6 is bonded to each of the electrodes 7, similarly to the first embodiment. Thus, the mounting pads are electrically connected to the solder balls 7 through the upper buildup layer 40, the core substrate 10 and the lower buildup layer 50.

In this second embodiment, when various device chips having different chip sizes are mounted on packaging substrates, respectively, it is possible to mount the various device chips having the different chip sizes, by changing the positions of the mounting pads 2 formed of the second upper buildup wiring layer 44 of the upper buildup layer 40, and also by correspondingly changing the position of the Bu2-via holes 46 formed in the second upper insulating layer 43 and the position of the first buildup wiring layer 42 or the Bu1-via holes 45 formed in the first upper insulating layer 41. Accordingly, it is not necessary to change the positions of the respective patterns formed of the core wiring layer (GND plane) 12 of the core substrate 10 and the positions of the C-via holes 14.

In this second embodiment, since the lower buildup layer 50 under the core substrate has a double-layer structure, if the positions of the first lower wiring layer 52, the Bd1-via holes 45 and the Bd2-via holes 46 are suitably changed, it is possible to elevate the degree of freedom in determining a relative position between the C-via holes 14 of the core substrate and the electrodes 7 formed of the second lower wiring layer 54, and also, it is possible to arbitrarily determine the array or location of signal terminals, GND terminals and Vdd terminals formed of the solder balls 6. Thus, the degree of design can be elevated, and it is possible to increase the number of the externally connecting electrodes, namely the number of the solder balls.

Accordingly, the second embodiment can use the standardized core substrate 10 having the core wiring layers 12 and 13 formed on the opposite surface thereof in predetermined patterns, respectively, with the result that the works for processing the core substrate can be completely eliminated, and therefore, the fabricating term can be further shortened.

In the above mentioned embodiments, the packaging substrate having the external size of the 27 mm square has been explained as an example. However, the present invention can be equally applied to a packaging substrate having the external size of a 31 mm square, a 35 mm square, a 40 mm square or a 45 mm square, so that various device chips having a chip size of a 9 mm square to a 17 mm square can be correspondingly mounted thereon.

In addition, in fabricating packaged semiconductor devices having packaging substrate having different external sizes, it is possible to use the same standardized core substrate by properly setting the location of the mounting pads of the buildup wiring layer, with the result that the term and the cost for fabricating the packaged semiconductor devices having different external sizes can be reduced.

In the above mentioned embodiments, the packaging substrate having the core substrate having one layer of core wiring layer formed on each surface of the insulating substrate has been explained as an example. The present invention can be equally applied to a packaging substrate having the core substrate having two layers of core wiring layers formed on each surface of the insulating substrate.

As mentioned above, in a packaged semiconductor device having a packaging substrate comprising a core substrate and buildup layers formed on an upper surface and a lower surface of the core substrate, respectively, each of the buildup layers including a wiring layer, and a semiconductor device chip being mounted on the upper buildup layer, the present invention is characterized in that semiconductor device chips having different chip sizes can be mounted on the packaging substrate without changing the position of core via holes formed in the core substrate, by changing the mounting pads of the upper buildup layer and the wiring patterns extending form the mounding pads, and also by correspondingly changing the position of the via holes of the upper buildup layer.

Thus, by using the general-purpose core substrate having the standardized positions of core via holes, it is possible to mount semiconductor device chips having different chip sizes, and furthermore, to realize packaged semiconductor devices having different external sizes. As a result, the number of steps for designing and fabricating the core substrate can be reduced, so that the term and the cost for fabricating the packaged semiconductor devices can be reduced.

The invention has thus been shown and described with reference to the specific embodiments. However, it should be noted that the present invention is in no way limited to the details of the illustrated structures but changes and modifications may be made within the scope of the appended claims.

What is claimed is:

1. A packaged semiconductor device comprising a packaging substrate having a core substrate having core wiring layers formed on opposite surfaces thereof, respectively, and a plurality of core via holes in said core substrate for mutually electrically connecting said core wiring layers, and upper and lower buildup layers formed on an upper surface and a lower surface of said core substrate, respectively, and each having a wiring layer on a surface opposite to said core substrate, a semiconductor device chip mounted on mounting pads formed on said upper buildup layer, and externally connecting electrodes formed on said lower buildup layer, wherein the position of said core via holes in said core substrate is standardized, and said mounting pads formed on said upper buildup layer are located to coincide with a plurality of connection terminals of said semiconductor device chip.

2. A packaged semiconductor device claimed in claim 1 wherein said core substrate includes an insulating substrate having opposite upper and lower surfaces each having at least one core wiring layer formed thereon, and wherein said mounting pads are electrically connected to the core wiring layer formed on said upper surface of said insulating substrate through buildup via holes formed in said upper buildup layer, and said externally connecting electrodes are electrically connected to the core wiring layer formed on said lower surface of said insulating substrate through buildup via holes formed in said lower buildup layer.

3. A packaged semiconductor device claimed in claim 1 wherein each of said upper buildup layer and said lower buildup layer includes a plurality of laminated wiring layers, and wherein said mounting pads are formed of an uppermost wiring layer of said plurality of laminated wiring layers in said upper buildup layer, and a lowermost wiring layer of said plurality of laminated wiring layers in said upper buildup layer is connected to said core via holes, and wherein said externally connecting electrodes are formed of a lowermost wiring layer of said plurality of laminated wiring layers in said lower buildup layer, and an uppermost wiring layer of said plurality of laminated wiring layers in said lower buildup layer is connected to said core via holes.

4. A packaged semiconductor device claimed in claim 1 wherein said semiconductor device chip is a flip chip type semiconductor device, and wherein said mounting pads are located to coincide with flip chip terminals of said semiconductor device chip.

5. A packaged semiconductor device claimed in claim 1 wherein said mounting pads include signal pads, ground pads and power supply pads, and said core wiring layer or a lower wiring layer in said upper buildup layer is divided into a plurality of patterns which are electrically insulated from one another to correspond to respective mounting pads and which are electrically connected to the respective mounting pads through via holes formed in said upper buildup layer.

6. A method for fabricating a packaged semiconductor device, comprising the steps of:

forming a packaging substrate having a core substrate having core wiring layers formed on opposite surfaces thereof, respectively, and a plurality of core via holes formed in said core substrate at standardized positions for mutually electrically connecting said core wiring layers, an upper buildup layer formed on an upper surface of said core substrate and having a plurality of mounting pads, and a lower buildup layer formed on a lower surface of said core substrate and having a plurality of externally connecting electrodes; and mounting a semiconductor device chip on said mounting pads, wherein in a step for forming said upper buildup layer, a location pattern of said mounting pads formed on said upper buildup layer is determined in accordance with the kind of said semiconductor device chip to be mounted, to coincide said mounting pads to a plurality of connection terminals of said semiconductor device chip to be mounted.

7. A method for fabricating a packaged semiconductor device claimed in claim 6 wherein each of said upper buildup layer and said lower buildup layer has one wiring layer and wherein at the same time as said location pattern of said mounting pads is determined, a pattern shape of a wiring layer formed at the same level as said mounting pads, a pattern shape of said core wiring layer formed on the upper surface of said core substrate, and a location position of via holes formed in said upper buildup layer for connecting between said core wiring layer formed on the upper surface of said core substrate and said wiring layer formed at the same level as said mounting pads are determined.

8. A method for fabricating a packaged semiconductor device claimed in claim 6 wherein each of said upper buildup layer and said lower buildup layer includes a plurality of laminated wiring layers, and wherein, in a step for forming said upper buildup layer, said mounting pads are formed of an uppermost wiring layer of said plurality of laminated wiring layers in said upper buildup layer, and a location position of said mounting pads is determined in accordance with the kind of said semiconductor device chip to be mounted, and simultaneously, a pattern shape of said uppermost wiring layer extending from said mounting pads, a pattern shape of an underlying wiring layer located under said uppermost wiring layer, and a location position of via holes formed in said upper buildup layer for connecting between said uppermost wiring layer and said underlying wiring layer are determined.

9. A method for fabricating a packaged semiconductor device claimed in claim 6 wherein said externally connecting electrodes of said lower buildup layer are connected through said core via holes to said mounting pads, and a solder ball is bonded on each of said externally connecting electrodes.

* * * * *